(12) United States Patent
Ziai et al.

(10) Patent No.: US 12,438,095 B1
(45) Date of Patent: Oct. 7, 2025

(54) COMPLEX SYSTEM-IN-PACKAGE ARCHITECTURES LEVERAGING HIGH-BANDWIDTH LONG-REACH DIE-TO-DIE CONNECTIVITY OVER PACKAGE SUBSTRATES

(71) Applicant: Eliyan Corporation, Los Altos, CA (US)

(72) Inventors: Syrus Ziai, Los Altos, CA (US); Ramin Farjadrad, Los Altos, CA (US)

(73) Assignee: Eliyan Corp., Santa Clara, CA (US)

( * ) Notice: Subject to any disclaimer, the term of this patent is extended or adjusted under 35 U.S.C. 154(b) by 565 days.

(21) Appl. No.: 17/737,966

(22) Filed: May 5, 2022

Related U.S. Application Data

(60) Provisional application No. 63/184,842, filed on May 6, 2021.

(51) Int. Cl.
*H01L 23/538* (2006.01)
*H01L 23/00* (2006.01)
(Continued)

(52) U.S. Cl.
CPC ........ *H01L 23/5386* (2013.01); *H01L 23/145* (2013.01); *H01L 23/5382* (2013.01);
(Continued)

(58) Field of Classification Search
CPC ............... H01L 25/16; H01L 25/165; H01L 23/538–5381; H01L 23/5383; H01L 23/5386
See application file for complete search history.

(56) References Cited

U.S. PATENT DOCUMENTS

| 4,334,305 A | 6/1982 | Girardi |
| 5,396,581 A | 3/1995 | Mashiko |

(Continued)

FOREIGN PATENT DOCUMENTS

WO   WO-2018034787 A1 *  2/2018   ......... G06F 12/0802

OTHER PUBLICATIONS

U.S. Appl. No. 16/812,234; Mohsen F. Rad; filed Mar. 6, 2020.
(Continued)

*Primary Examiner* — Evan G Clinton
(74) *Attorney, Agent, or Firm* — Lance Kreisman; Peninsula Patent Group

(57) ABSTRACT

A physical layer interconnect between chips/chiplets provides high bandwidth communication with low power requirements using an organic substrate such as a printed circuit board. An interface between first and second chiplets uses a separate chiplet, or a combination logic die and interconnect interface, interfacing with the interconnect. A connection between a computing device and a memory can be longer, allowing the computing device to be coupled to more memories, expansion slots, or external connections. The interconnect can route memory commands between computing devices and memories, allowing multiple and different computing devices to be coupled to each other or to multiple and different memories. The memories can perform in-memory computing using chiplets coupled thereto. The interconnect couples to possibly different computing devices and possibly different memories, such as in a rack configuration, including CPUs or GPUs. The specialized processing devices can include one or more TPUs or VPUs.

20 Claims, 10 Drawing Sheets

(51) Int. Cl.
    *H01L 23/14* (2006.01)
    *H01L 25/00* (2006.01)
    *H01L 25/065* (2023.01)

(52) U.S. Cl.
    CPC .......... *H01L 24/16* (2013.01); *H01L 25/0652* (2013.01); *H01L 25/0655* (2013.01); *H01L 25/50* (2013.01); *H01L 23/5381* (2013.01); *H01L 2224/16145* (2013.01); *H01L 2224/16225* (2013.01); *H01L 2924/1431* (2013.01); *H01L 2924/1432* (2013.01); *H01L 2924/1433* (2013.01); *H01L 2924/1436* (2013.01); *H01L 2924/1437* (2013.01)

(56) References Cited

U.S. PATENT DOCUMENTS

| | | |
|---|---|---|
| 5,677,569 A | 10/1997 | Choi |
| 5,892,287 A | 4/1999 | Hoffman |
| 5,910,010 A | 6/1999 | Nishizawa |
| 6,031,729 A | 2/2000 | Berkely |
| 6,055,235 A | 4/2000 | Blanc |
| 6,417,737 B1 | 7/2002 | Moloudi |
| 6,690,742 B2 | 2/2004 | Chan |
| 6,721,313 B1 | 4/2004 | Van Duyne |
| 6,932,618 B1 | 8/2005 | Nelson |
| 7,027,529 B1 | 4/2006 | Ohishi |
| 7,248,890 B1 | 7/2007 | Raghavan |
| 7,269,212 B1 | 9/2007 | Chau |
| 7,477,615 B2 | 1/2009 | Oshita |
| 7,535,958 B2 | 5/2009 | Best |
| 7,701,957 B1 | 4/2010 | Bicknell |
| 7,907,469 B2 | 3/2011 | Sohn et al. |
| 7,978,754 B2 | 7/2011 | Yeung |
| 8,004,330 B1 | 8/2011 | Acimovic |
| 8,024,142 B1 | 9/2011 | Gagnon |
| 8,121,541 B2 | 2/2012 | Rofougaran |
| 8,176,238 B2 | 5/2012 | Yu et al. |
| 8,483,579 B2 | 7/2013 | Fukuda |
| 8,546,955 B1 | 10/2013 | Wu |
| 8,704,364 B2 | 4/2014 | Banijamali et al. |
| 8,861,573 B2 | 10/2014 | Chu |
| 8,948,203 B1 | 2/2015 | Nolan |
| 8,982,905 B2 | 3/2015 | Kamble |
| 9,088,334 B2 | 7/2015 | Chakraborty |
| 9,106,229 B1 | 8/2015 | Hutton |
| 9,129,935 B1 | 9/2015 | Chandrasekar |
| 9,294,313 B2 | 3/2016 | Prokop |
| 9,349,707 B1 | 5/2016 | Sun |
| 9,379,878 B1 | 6/2016 | Lugthart |
| 9,432,298 B1 | 8/2016 | Smith |
| 9,832,006 B1 | 11/2017 | Bandi |
| 9,886,275 B1 | 2/2018 | Carlson |
| 9,961,812 B2 | 5/2018 | Suorsa |
| 10,171,115 B1 | 1/2019 | Shirinfar |
| 10,402,363 B2 | 9/2019 | Long et al. |
| 10,410,694 B1 | 9/2019 | Arbel |
| 10,439,661 B1 | 10/2019 | Heydari |
| 10,642,767 B1 | 5/2020 | Farjadrad |
| 10,678,738 B2 | 6/2020 | Dai |
| 10,735,176 B1 | 8/2020 | Heydari |
| 10,748,852 B1 | 8/2020 | Sauter |
| 10,803,548 B2 | 10/2020 | Matam et al. |
| 10,804,204 B2 | 10/2020 | Rubin et al. |
| 10,855,498 B1 | 12/2020 | Farjadrad |
| 10,935,593 B2 | 3/2021 | Goyal |
| 11,088,876 B1 | 8/2021 | Farjadrad |
| 11,100,028 B1 | 8/2021 | Subramaniam |
| 11,164,817 B2 | 11/2021 | Rubin et al. |
| 11,204,863 B2 | 12/2021 | Sheffler |
| 11,782,865 B1 | 10/2023 | Kochavi |
| 11,789,649 B2 | 10/2023 | Chatterjee et al. |
| 11,841,815 B1 | 12/2023 | Farjadrad |
| 11,842,986 B1 | 12/2023 | Farjadrad |
| 11,855,043 B1 | 12/2023 | Farjadrad |
| 11,855,056 B1 | 12/2023 | Rad |
| 11,892,242 B2 | 2/2024 | Mao |
| 11,893,242 B1 | 2/2024 | Farjadrad |
| 11,983,125 B2 | 5/2024 | Soni |
| 12,001,355 B1 | 6/2024 | Dreier |
| 12,001,725 B2 | 6/2024 | Chatterjee |
| 2002/0122479 A1 | 9/2002 | Agazzi |
| 2002/0136315 A1 | 9/2002 | Chan |
| 2004/0088444 A1 | 5/2004 | Baumer |
| 2004/0113239 A1 | 6/2004 | Prokofiev |
| 2004/0130347 A1 | 7/2004 | Moll |
| 2004/0156461 A1 | 8/2004 | Agazzi |
| 2005/0041683 A1 | 2/2005 | Kizer |
| 2005/0134306 A1 | 6/2005 | Stojanovic |
| 2005/0157781 A1 | 7/2005 | Ho |
| 2005/0205983 A1 | 9/2005 | Origasa |
| 2006/0060376 A1 | 3/2006 | Yoon |
| 2006/0103011 A1 | 5/2006 | Andry |
| 2006/0158229 A1 | 7/2006 | Hsu |
| 2006/0181283 A1 | 8/2006 | Wajcer |
| 2006/0188043 A1 | 8/2006 | Zerbe |
| 2006/0250985 A1 | 11/2006 | Baumer |
| 2006/0251194 A1 | 11/2006 | Bublil |
| 2007/0281643 A1 | 12/2007 | Kawai |
| 2008/0063395 A1 | 3/2008 | Royle |
| 2008/0143422 A1 | 6/2008 | Lalithambika |
| 2008/0186987 A1 | 8/2008 | Baumer |
| 2008/0222407 A1 | 9/2008 | Carpenter |
| 2009/0113158 A1 | 4/2009 | Schnell |
| 2009/0154365 A1 | 6/2009 | Diab |
| 2009/0174448 A1 | 7/2009 | Zabinski |
| 2009/0220240 A1 | 9/2009 | Abhari |
| 2009/0225900 A1 | 9/2009 | Yamaguchi |
| 2009/0304054 A1 | 12/2009 | Tonietto |
| 2010/0177841 A1 | 7/2010 | Yoon |
| 2010/0197231 A1 | 8/2010 | Kenington |
| 2010/0294547 A1 | 11/2010 | Hatanaka |
| 2011/0029803 A1 | 2/2011 | Redman-White |
| 2011/0038286 A1 | 2/2011 | Ta |
| 2011/0167297 A1 | 7/2011 | Su |
| 2011/0187430 A1 | 8/2011 | Tang |
| 2011/0204428 A1 | 8/2011 | Erickson |
| 2011/0267073 A1 | 11/2011 | Chengson |
| 2011/0293041 A1 | 12/2011 | Luo |
| 2012/0082194 A1 | 4/2012 | Tam |
| 2012/0182776 A1 | 7/2012 | Best |
| 2012/0192023 A1 | 7/2012 | Lee |
| 2012/0216084 A1 | 8/2012 | Chun |
| 2012/0327818 A1 | 12/2012 | Takatori |
| 2013/0181257 A1 | 7/2013 | Ngai |
| 2013/0222026 A1 | 8/2013 | Havens |
| 2013/0249290 A1 | 9/2013 | Buonpane |
| 2013/0285584 A1 | 10/2013 | Kim |
| 2014/0016524 A1 | 1/2014 | Choi |
| 2014/0048947 A1 | 2/2014 | Lee |
| 2014/0126613 A1 | 5/2014 | Zhang |
| 2014/0192583 A1 | 7/2014 | Rajan |
| 2014/0269860 A1 | 9/2014 | Brown |
| 2014/0269983 A1 | 9/2014 | Baeckler |
| 2015/0012677 A1 | 1/2015 | Nagarajan |
| 2015/0172040 A1 | 6/2015 | Pelekhaty |
| 2015/0180760 A1 | 6/2015 | Rickard |
| 2015/0206867 A1 | 7/2015 | Lim |
| 2015/0271074 A1 | 9/2015 | Hirth |
| 2015/0326348 A1 | 11/2015 | Shen |
| 2015/0358005 A1 | 12/2015 | Chen |
| 2016/0056125 A1 | 2/2016 | Pan |
| 2016/0071818 A1 | 3/2016 | Wang |
| 2016/0111406 A1 | 4/2016 | Mak |
| 2016/0217872 A1 | 7/2016 | Hossain |
| 2016/0294585 A1 | 10/2016 | Rahman |
| 2017/0286340 A1 | 10/2017 | Ngo |
| 2017/0317859 A1 | 11/2017 | Hormati |
| 2017/0331651 A1 | 11/2017 | Suzuki |
| 2018/0010329 A1 | 1/2018 | Golding, Jr. |
| 2018/0082981 A1 | 3/2018 | Gowda |
| 2018/0175001 A1 | 6/2018 | Pyo |
| 2018/0190635 A1 | 7/2018 | Choi |
| 2018/0196767 A1 | 7/2018 | Linstadt |

(56) References Cited

U.S. PATENT DOCUMENTS

| | | |
|---|---|---|
| 2018/0210830 A1 | 7/2018 | Malladi et al. |
| 2018/0315735 A1 | 11/2018 | Delacruz |
| 2019/0044764 A1 | 2/2019 | Hollis |
| 2019/0058457 A1 | 2/2019 | Ran |
| 2019/0108111 A1 | 4/2019 | Levin |
| 2019/0198489 A1 | 6/2019 | Kim |
| 2019/0267062 A1 | 8/2019 | Tan |
| 2019/0319626 A1 | 10/2019 | Dabral |
| 2020/0051961 A1 | 2/2020 | Rickard |
| 2020/0105718 A1 | 4/2020 | Collins et al. |
| 2020/0119736 A1* | 4/2020 | Weber ............. H03K 19/17756 |
| 2020/0257619 A1 | 8/2020 | Sheffler |
| 2020/0320026 A1 | 10/2020 | Kabiry |
| 2020/0364142 A1 | 11/2020 | Lin |
| 2020/0373286 A1 | 11/2020 | Dennis |
| 2021/0056058 A1 | 2/2021 | Lee |
| 2021/0082875 A1 | 3/2021 | Nelson |
| 2021/0117102 A1 | 4/2021 | Grenier |
| 2021/0181974 A1 | 6/2021 | Ghosh |
| 2021/0183842 A1 | 6/2021 | Fay |
| 2021/0193567 A1 | 6/2021 | Cheah et al. |
| 2021/0225827 A1 | 7/2021 | Lanka |
| 2021/0258078 A1 | 8/2021 | Meade |
| 2021/0311900 A1 | 10/2021 | Malladi |
| 2021/0365203 A1 | 11/2021 | O |
| 2021/0391303 A1* | 12/2021 | Lung ................... H01L 23/5384 |
| 2021/0405919 A1 | 12/2021 | K |
| 2022/0051989 A1 | 2/2022 | Agarwal |
| 2022/0159860 A1 | 5/2022 | Winzer |
| 2022/0223522 A1 | 7/2022 | Scearce |
| 2022/0350756 A1 | 11/2022 | Burstein |
| 2022/0391114 A1 | 12/2022 | Richter |
| 2023/0039033 A1 | 2/2023 | Zarkovsky |
| 2023/0068802 A1 | 3/2023 | Wang |
| 2023/0090061 A1 | 3/2023 | Zarkovsky |
| 2023/0181599 A1 | 6/2023 | Du et al. |
| 2023/0289311 A1 | 9/2023 | Noguera Serra |
| 2024/0007234 A1 | 1/2024 | Harrington |
| 2024/0028208 A1 | 1/2024 | Kim |
| 2024/0241840 A1 | 7/2024 | Im |

OTHER PUBLICATIONS

Block Memory Generator v8.2 LogiCORE IP Product Guide Vivado Design Suite; Xilinx; Apr. 1, 2015.

Kurt Lender et al., "Questions from the Compute Express Link Exploring Coherent Memory and Innovative Cases Webinar", Apr. 13, 2020, CXL consortium.

Planet Analog, "The basics of SerDes (serializers/deserializers) for interfacing", Dec. 1, 2020, Planet Analog.

Farjadrad et al., "A Bunch of Wires (B0W) Interface for Inter-Chiplet Communication", 2019 IEEE Symposium on High-Performance Interconnects (HOTI), pp. 27-30, Oct. 2019.

Universal Chiplet Interconnect Express (UCIe) Specification Rev. 1.0, Feb. 24, 2022.

"Hot Chips 2017: Intel Deep Dives Into EMIB", TomsHardware.com; Aug. 25, 2017.

"Using Chiplet Encapsulation Technology to Achieve Processing-In-Memory Functions"; Micromachines 2022, 13, 1790; https://www.mdpi.com/journal/micromachines; Tian et al.

"Multiport memory for high-speed interprocessor communication in MultiCom;" Scientia Iranica, vol. 8, No. 4, pp. 322-331; Sharif University of Technology, Oct. 2001; Asgari et al.

Universal Chiplet Interconnect Express (UCIe) Specification, Revision 1.1, Version 1.0, Jul. 10, 2023.

Hybrid Memory Cube Specification 2.1, Hybrid Memory Cube Consortium, HMC-30G-VSR PHY, 2014.

* cited by examiner

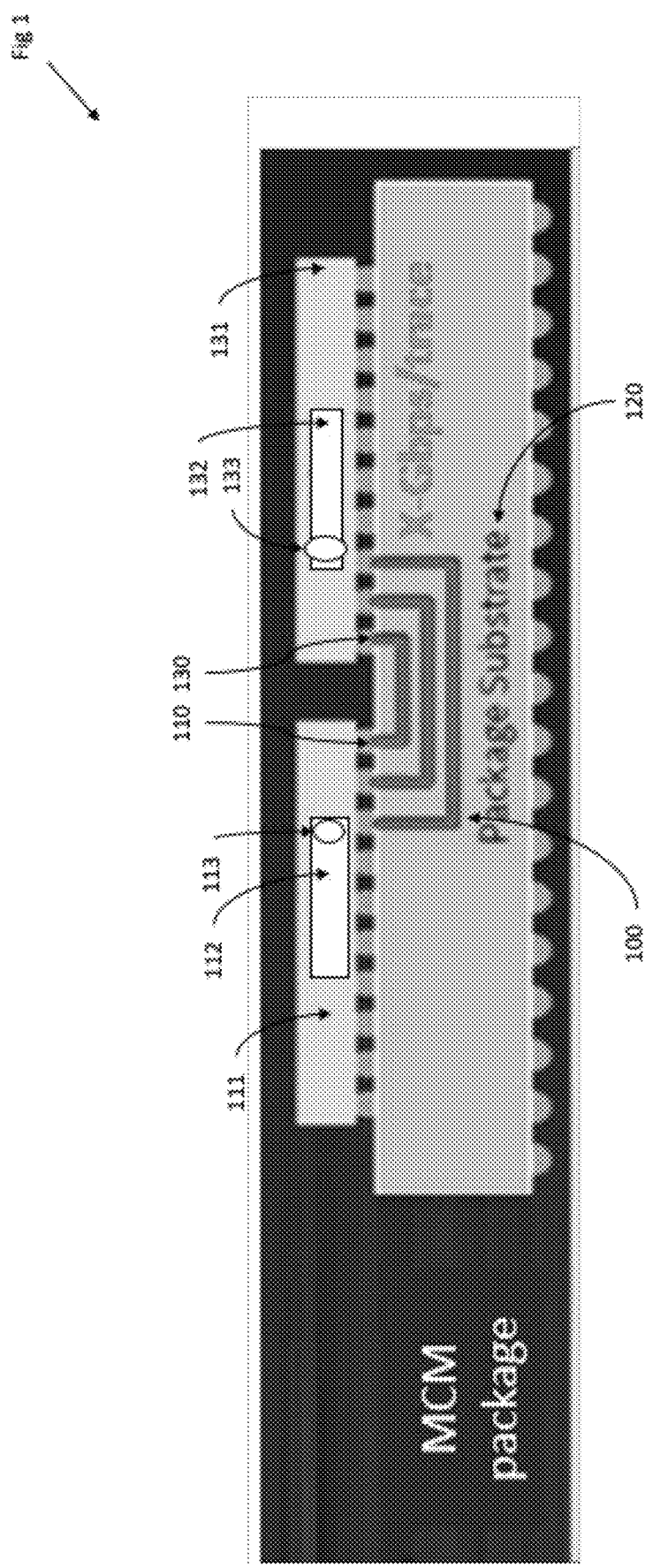

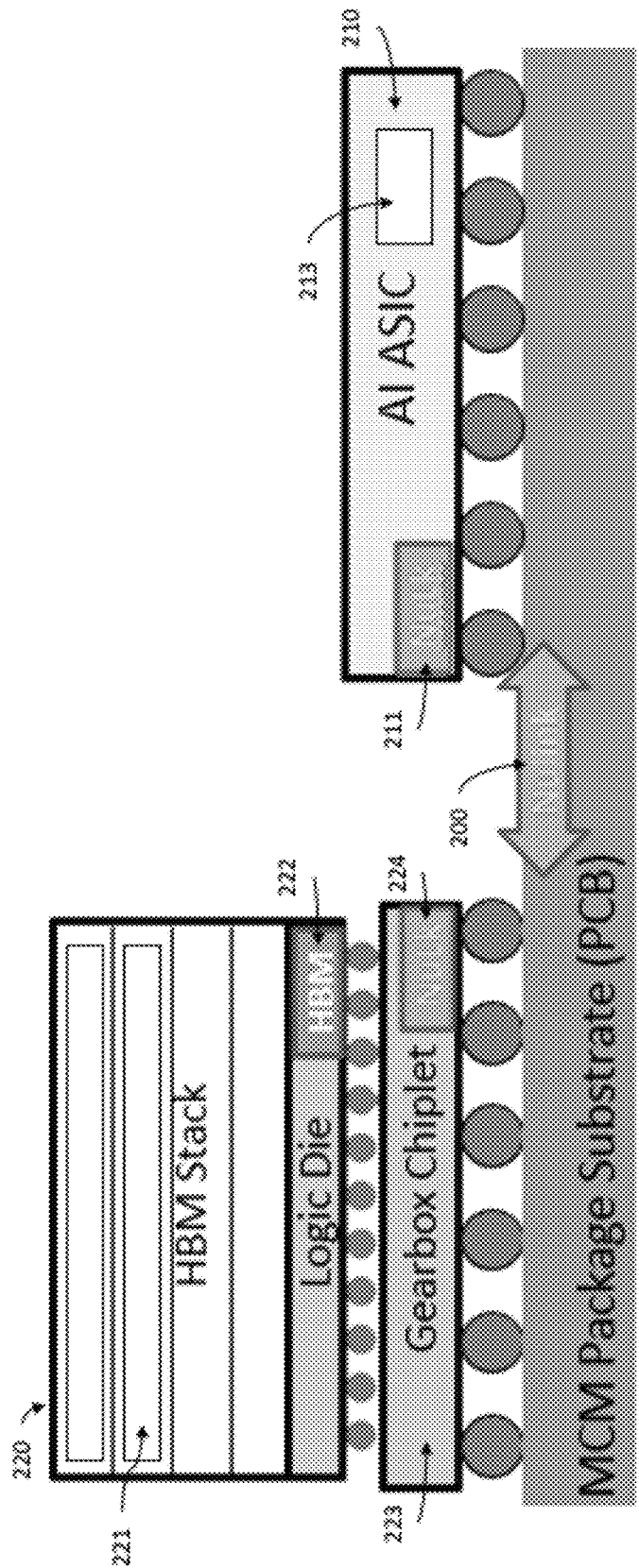

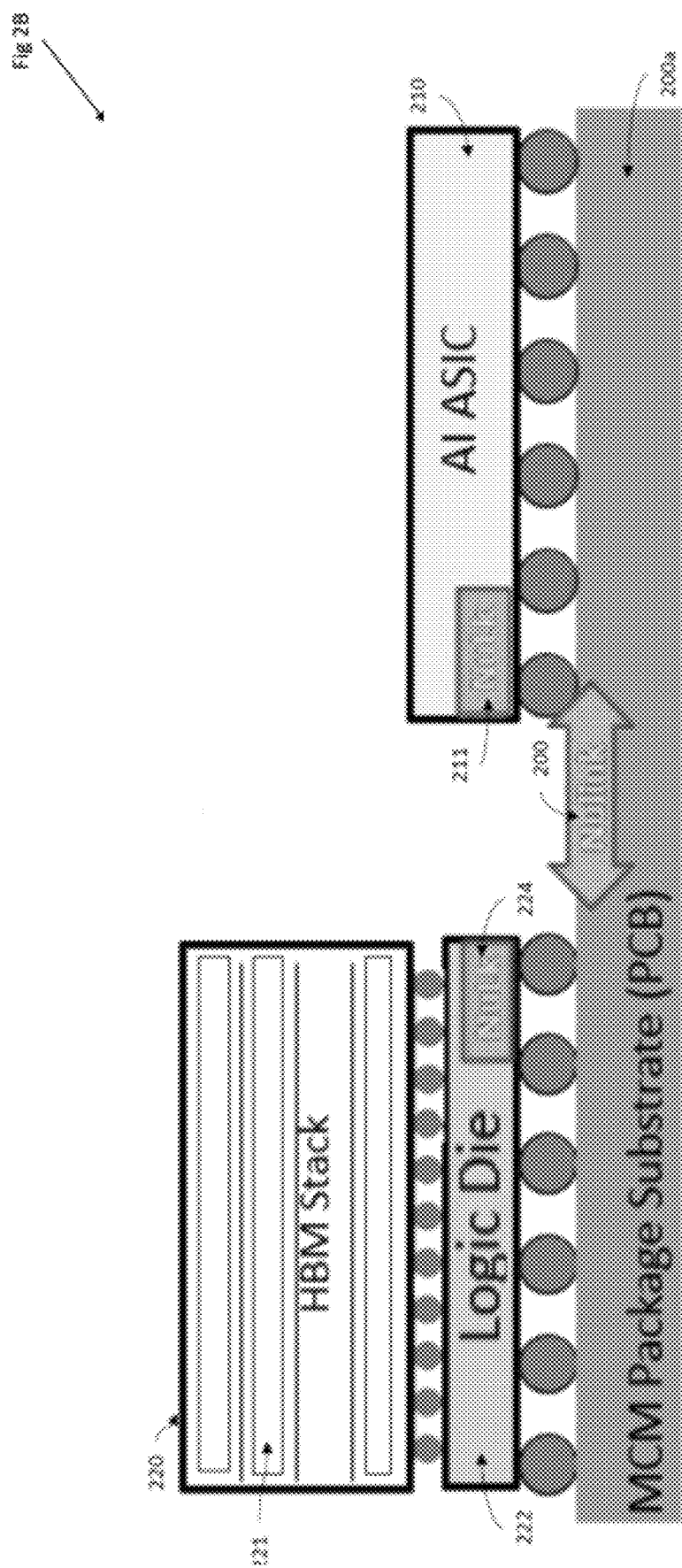

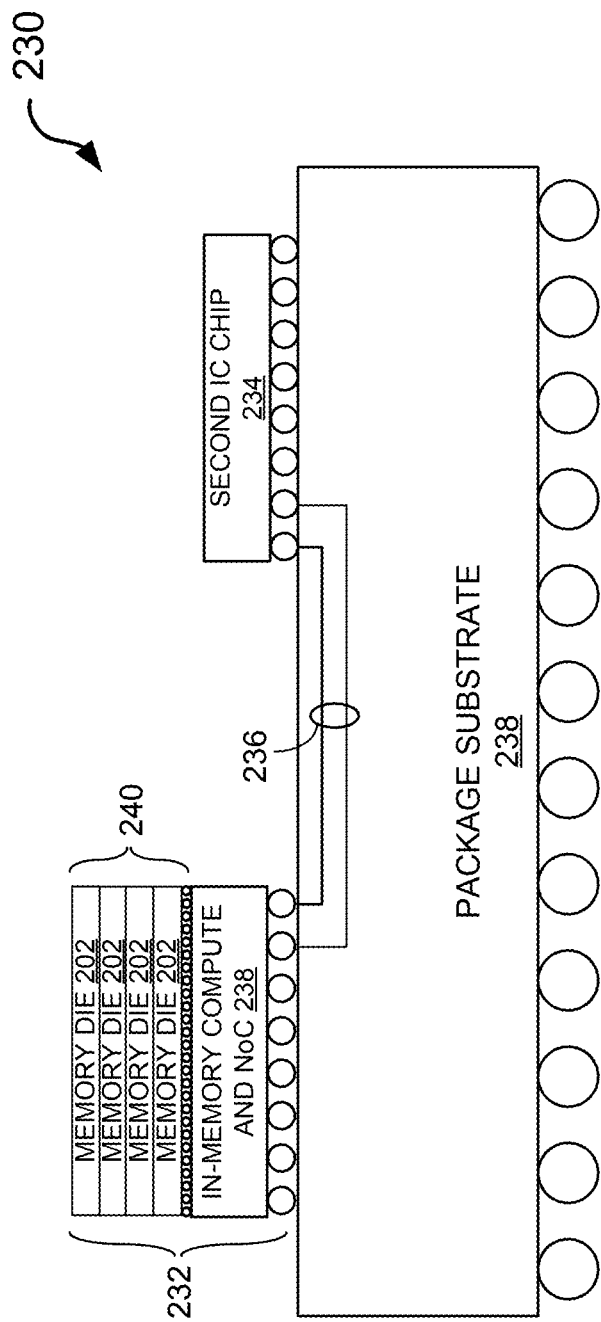

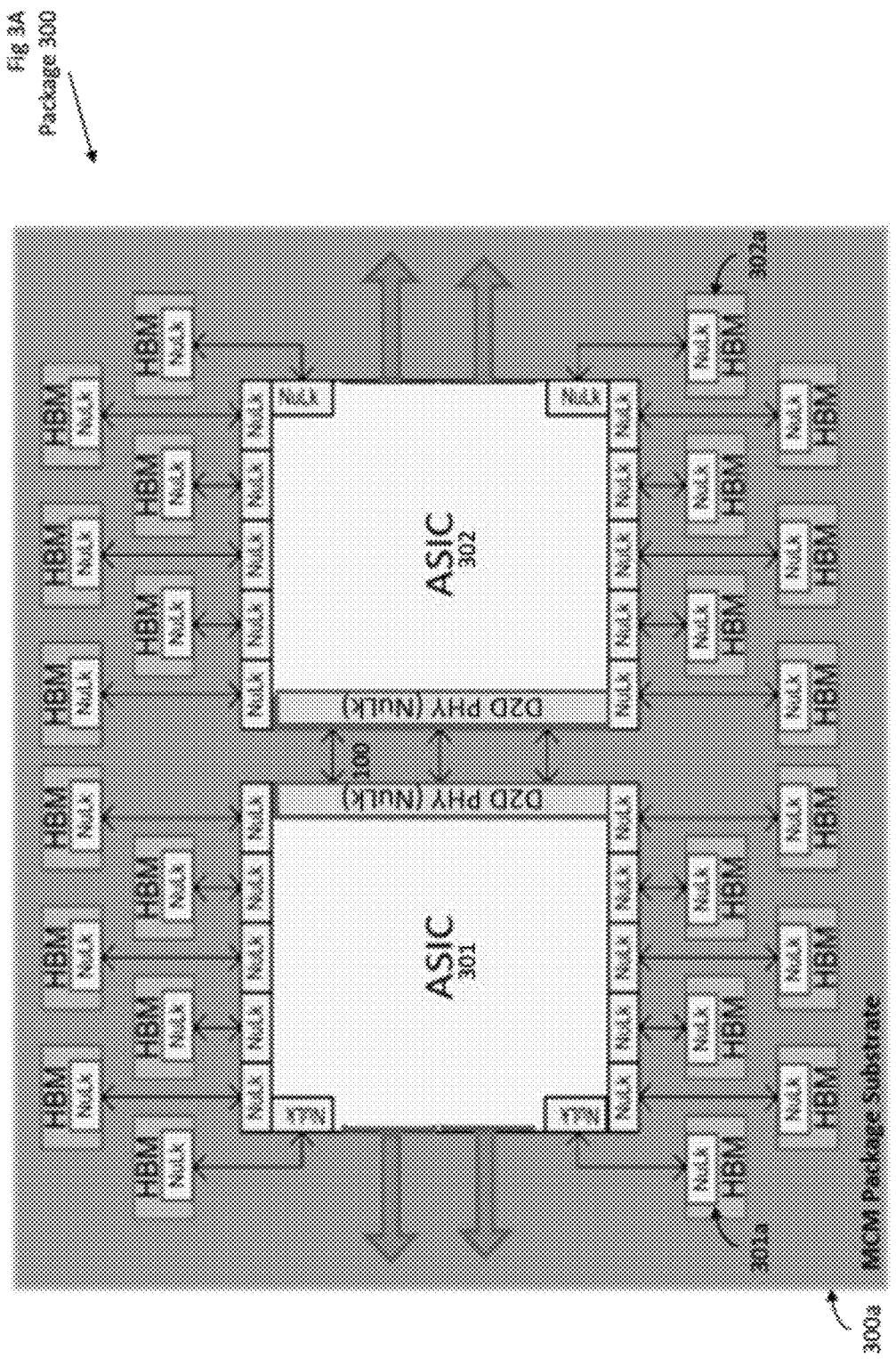
Fig 3A Package 300

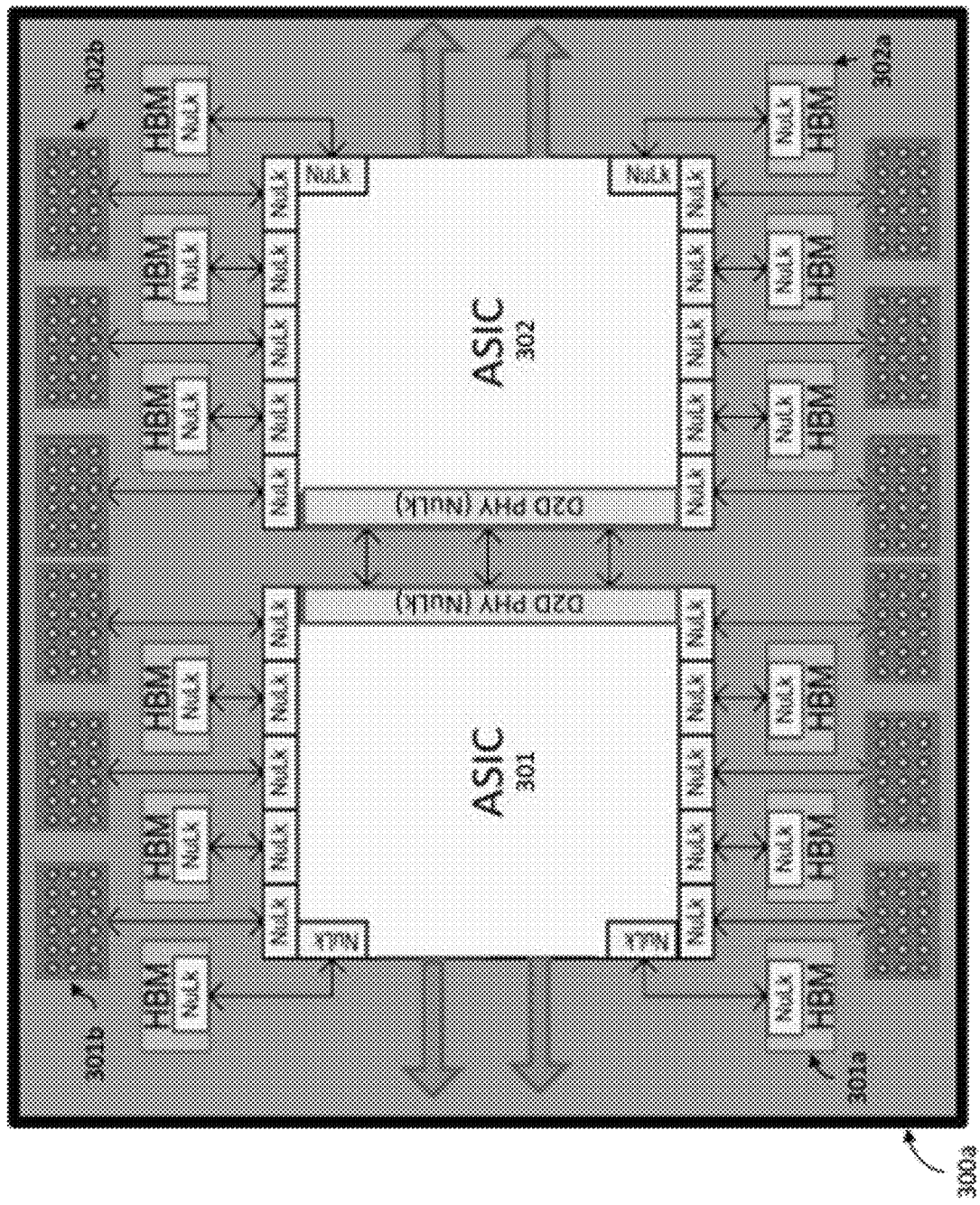
Fig 3B Alternative Package 300

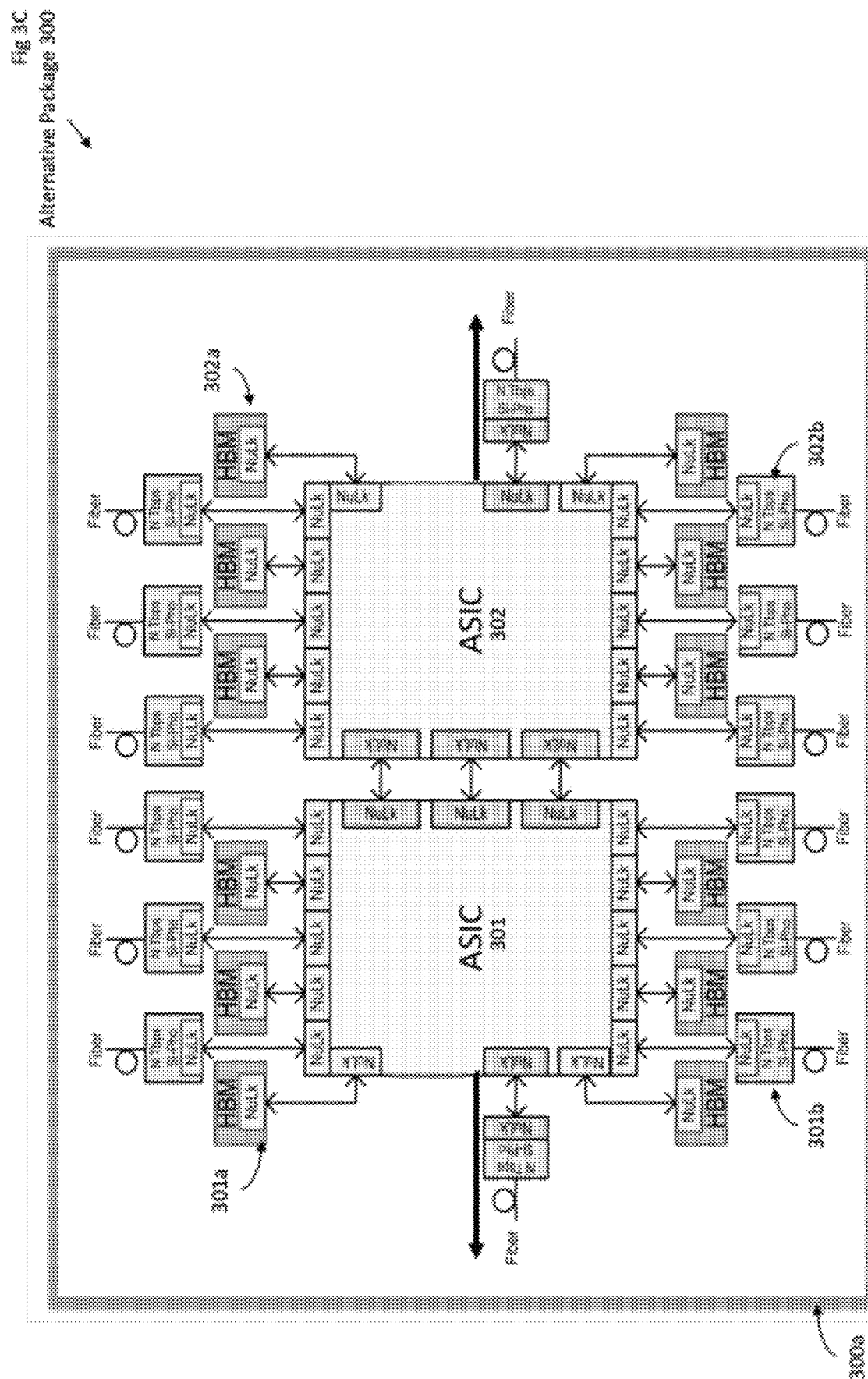
FIG. 3C Alternative Package 300

COMPLEX SYSTEM-IN-PACKAGE ARCHITECTURES LEVERAGING HIGH-BANDWIDTH LONG-REACH DIE-TO-DIE CONNECTIVITY OVER PACKAGE SUBSTRATES

INCORPORATED DISCLOSURES

Priority Claim. This Application describes technologies that can be used with inventions, and other technologies, described in one or more of the following documents. This application claims priority, to the fullest extent permitted by law, of these documents.

This application claims priority of the following documents, and all documents which those documents incorporate by reference.

- U.S. Provisional Appl. 63/184,842, filed May 6, 2021, in the name of first inventor Syrus Ziai, titled "Implementing complex system-in-package architectures leveraging high-bandwidth long-reach die-to-die connectivity over MCM package substrates".
- U.S. Provisional Appl. 63/190,170, filed May 18, 2021, in the name of first inventor Ramin Farjadrad, titled "Novel architecture for DRAM control optimization using simultaneous bidirectional memory interfaces".
- U.S. Provisional Appl. 63/283,265, filed Nov. 25, 2021, in the name of first inventor Ramin Farjadrad, titled "Enabling advance system-in-package architectures at low-cost using high-bandwidth ultra-short-reach (USR) connectivity in MCM packages".
- U.S. Provisional Appl. 63/295,524, filed Dec. 31, 2021, in the name of first inventor Ramin Farjadrad, titled "Innovative low-cost packaging solutions for system in package and the HBM crossover PHY architecture".
- U.S. application Ser. No. 16/812,234, filed Mar. 6, 2020, in the name of first inventor Mohsen F. Rad, titled "Low cost solution for 2.5D and 3D packaging using USR chiplets".

This Application also claims priority of the following documents, and all documents which those documents incorporate by reference.

- U.S. Pat. No. 10,572,416, issued Feb. 25, 2020, titled "Efficient signaling scheme for high-speed ultra short reach interfaces".
- U.S. Pat. No. 10,642,767, issued May 5, 2020, titled "Efficient signaling scheme for high-speed ultra short reach interfaces".
- U.S. Pat. No. 10,552,353, issued Feb. 4, 2020, titled "Simultaneous bidirectional serial link interface with optimized hybrid circuit".
- U.S. Pat. No. 10,855,498, issued Dec. 1, 2020, titled "Efficient signaling scheme for high-speed ultra short reach interfaces".
- U.S. application Ser. No. 16/365,510, filed Mar. 26, 2019, titled "Multi-chip module with configurable multimode serial link".
- U.S. application Ser. No. 16/867,442, filed May 5, 2020, titled "Efficient signaling scheme for high-speed ultra short reach interfaces".
- U.S. application Ser. No. 17/108,519, filed Dec. 1, 2020, titled "Efficient signaling scheme for high-speed ultra short reach interfaces".
- U.S. application Ser. No. 17/521,612, filed Oct. 8, 2021, titled "Efficient signaling scheme for high-speed ultra short reach interfaces".

These documents are hereby incorporated by reference as if fully set forth herein. Techniques described in this Application can be elaborated with detail found therein. These documents are sometimes referred to herein as the "Incorporated Disclosure," the "Incorporated Document," or variants thereof.

COPYRIGHT NOTICE

A portion of the disclosure of this patent document contains material subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

This background is provided as a convenience to the reader and does not admit to any prior art or restrict the scope of the disclosure or the invention. This background is intended as an introduction to the general nature of technology to which the disclosure or the invention can be applied.

Systems of circuits that are integrated onto a single chip, sometimes called "systems on a chip", and related terms, often involve a very large number of circuit elements being constructed on a single silicon die. As systems on a chip become more complex, it is often desirable to integrate more circuit elements on a silicon die. One way to increase the number of circuit elements on a silicon die is to make those circuit elements smaller.

A desire to make circuit elements smaller prompts the development of process technology that allows construction of circuit elements that have smaller dimensions, such as side lengths and widths. However, one problem that has arisen in the art is that smaller circuit elements involve more careful control of construction and placement of those circuit elements. Moreover, process technology has not been able to keep up with market desires to reduce the size of circuit elements. This has led to a desire for other solutions that are not subject to such drawbacks.

One proposed solution has been to make individual chips that each do not involve so many individual circuit elements, sometimes called "chiplets", and to combine those chiplets into a system having multiple such chiplets. While this proposed solution can provide the ability to create systems that have a sufficient number of circuit elements, it poses the problem that communication between those circuit elements can be limited by a number of connecting wires between chiplets.

Accordingly, one proposed method for coupling multiple such chiplets has been to provide a silicon "interposer", which is a silicon chip used as a substrate that is coupled to more than one distinct chiplet. While this proposed solution can provide communication between circuit elements on distinct chiplets, silicon interposers can involve a very large number of communication wires to be coupled between distinct chiplets. These communication wires might involve complex routing and/or dense layout within the silicon interposer. Silicon interposers might also need to be limited with respect to power consumption, which can limit the amount of communication bandwidth they can provide between distinct chiplets. This has led to a desire for other solutions that are not subject to such drawbacks.

One problem that has arisen in the art is that the silicon interposer being a silicon chip itself has a limited size, defined by the size of semiconductor mask reticle. Maximum manufacturable size of a silicon interposer is still significantly smaller than a conventional organic substrate. This size limitation limits the number of chiplets that can be integrated together in a package, and therefore limits the complexity and performance of the system in package.

Another proposed solution is EMDIB, an embedded interconnected communication link (sometimes called a "bus") proposed by Intel Corporation. While this proposed solution can provide a different technique for communication between circuit elements on distinct chiplets, it is very complex to manufacture and also proprietary to Intel. This has led to a desire for other solutions that are not subject to such drawbacks.

Each of these issues, as well as other possible considerations, might relate to aspects of coupling distinct chips and distinct chiplets that is not subject to the drawbacks described herein, not subject to other drawbacks not otherwise described herein, and related matters.

BRIEF DESCRIPTION OF THE FIGURES

In the figures, like references generally indicate similar elements, although this is not strictly required.

FIG. 1 shows a conceptual drawing of a system including an interface between a first and a second chiplet using a package substrate.

FIG. 2 (collectively including FIGS. 2A-2C) shows a conceptual drawing of a system including an interface between a computing device and a memory device using circuit logic and a package substrate. The circuit logic can include (FIG. 2A) a separate chiplet to interface with the physical interconnect, (FIG. 2B) a combination logic die and physical interconnect interface, or (FIG. 3C) a memory chiplet including a base die with a stack of memory die coupled IC chiplet.

FIG. 3 (collectively including FIGS. 3A-3C) shows a conceptual drawing of a system including multiple computing devices coupled to each other and to one or more of: (FIG. 3A) a relatively larger number of staggered memory devices using a set of physical interconnects with longer reach; (FIG. 3B) an expandable set of additional memory devices and/or other circuit elements; or (FIG. 3C) a set of hybrid interfaces between one or more of the computing devices and an external pool of other devices.

Figure 4:
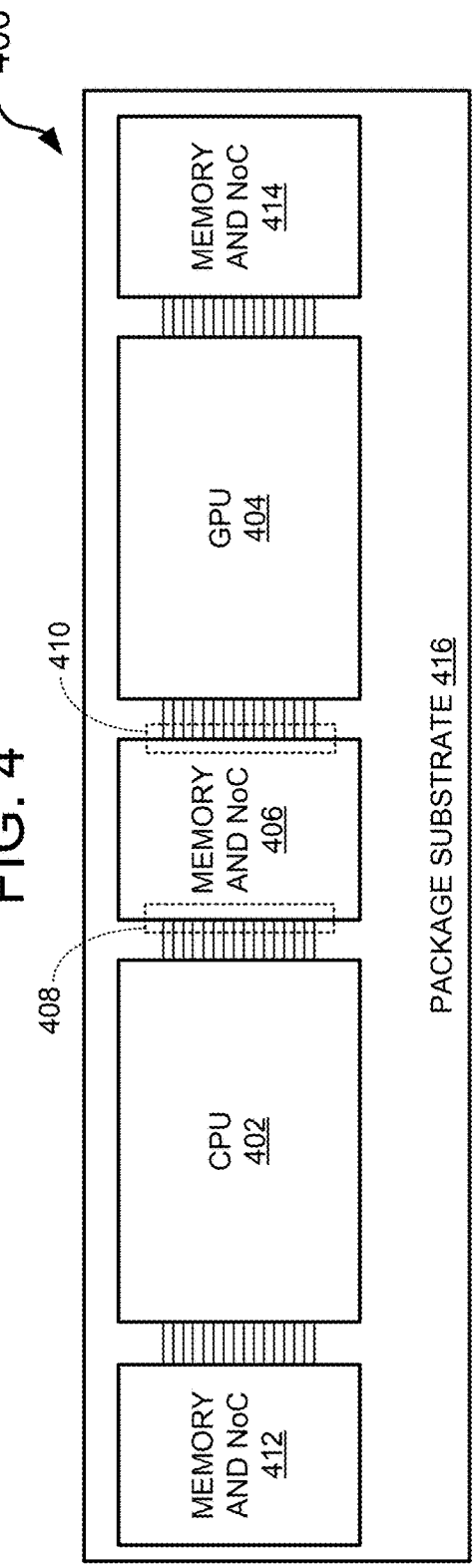
FIG. 4 shows one embodiment of an interconnection topology for a multi-chip module (MCM) architecture.

After reading this Application, those skilled in the art would recognize that the figures are not necessarily drawn to scale for construction, nor do they necessarily specify any particular location or order of construction.

DETAILED DESCRIPTION

General Discussion

Among other disclosures, this Application describes a system, and techniques for use, capable of a physical layer interconnect between distinct chips and distinct chiplets that can provide relatively high bandwidth communication with relatively low power requirements.

In one embodiment, the described physical layer interconnect can be disposed to interface with known physical interconnects and with interfaces already used by known chips and chiplets. Alternatively, the described physical layer interconnect can be disposed in a system including an interface between a first and a second chiplet using a separate chiplet to interface with the physical interconnect or using a logic die (sometimes referred to herein as a "chiplet") with an embedded physical interconnect interface; in either case, a computing device can be disposed to interface with a memory device using the described physical layer interconnect, whether or not the two devices were originally designed to use the described physical layer interconnect.

In one embodiment, the described physical layer interconnect can be disposed to couple to multiple computing devices to each other, and to couple each of the computing devices to a set of external devices. Thus, each of the multiple computing devices can be coupled to a substantially larger number of memory devices; to an expandable set of additional circuit elements, such as possibly memory devices or slots for coupling external devices; or to one or more hybrid interfaces between one or more of the computing devices and an external pool of other devices.

In one embodiment, the described physical layer interconnect can be disposed to couple a set of possibly different computing devices and a set of possibly different memory devices in a rack configuration, such as coupling one or more central processing units (CPUs) or otherwise general processing devices or one or more graphics processing units (GPUs) or otherwise specialized processing devices. For example, the specialized processing devices can include one or more tensor processing units (TPUs), video processing units (VPUs), or other devices disposed for specialized processing techniques. The set of possibly different computing devices can be disposed to be coupled to generalized memory devices or to memory devices specialized for operation with one or more specialized processing devices.

In one embodiment, the computing devices described herein can include an application-specific integrated circuit (ASIC), a processor, a system-on-a-chip, a floating-point gate array (FPGA), another type of computing device that can interface with one or more memory devices, or a combination or conjunction of multiple ones or multiple types of such devices.

In one embodiment, the memory devices described herein can include a high-bandwidth memory (HBM), a dynamic RAM (DRAM), static RAM (SRAM), a memory cache, a multi-level memory such as including one or more levels of cache and a memory device, a database, another type of memory device that can interface with one or more devices, or a combination or conjunction of multiple ones or multiple types of such devices.

Terms and Phrases

The following terms and phrases are exemplary only, and not limiting.

The phrases "this application", "this description", and variants thereof, generally refer to any material shown or suggested by any portions of this Application, individually or collectively, and including all inferences that might be drawn by anyone skilled in the art after reviewing this Application, even if that material would not have been apparent without reviewing this Application at the time it was filed.

The phrases "computing device", and variants thereof, generally refer to any device (or portion thereof) that might be disposed to issue read and/or write commands to a "memory device", such as described herein, or multiple ones or multiple types of such memory devices, whether in parallel or series, whether to one or more separate or banks thereof, whether to a distributed or singular such device, whether to a logically local or remote such device, or otherwise as described herein. For example, the computing device can include an application-specific integrated circuit (ASIC), a processor, a system-on-a-chip, a floating-point gate array (FPGA), another type of computing device that can interface with one or more memory devices, or a combination or conjunction of multiple ones or multiple types of such devices.

The phrases "memory device", and variants thereof, generally refer to any device (or portion thereof) that might be disposed to receive read and/or write commands from a "computing device", such as described herein, or multiple ones or multiple types of such computing devices, whether in parallel or series, whether to one or more separate or banks thereof, whether to a distributed or singular such device, whether from a logically local or remote such device, or otherwise as described herein. For example, the memory device can include a dynamic RAM (DRAM), static RAM (SRAM), a memory cache, a multi-level memory such as including one or more levels of cache and a memory device, a database, another type of memory device that can interface with one or more devices, or a combination or conjunction of multiple ones or multiple types of such devices.

The phrases "communication link", "communication bus" and variants thereof, generally refer to any device (or portion thereof) that might be disposed to send information from a first device to a second device, whether or not that information is retained at the first device, whether or not that information is acknowledged or assured to be received by the second device, whether or not that information undergoes substantial delay or is transmitted by intermediate devices, or otherwise as described herein. For example, a communication link can include an electrical, optical, or electro-optical coupling between the first and second devices, a circuit-switched or packet-switched network including the first and second devices, a redundant modular or otherwise reliable distributed communication system, or otherwise as described herein.

After reviewing this Application, those skilled in the art would recognize that these terms and phrases should be interpreted in light of their context in the specification.

FIGURES AND TEXT

FIG. 1—Interface Using a Package Substrate

FIG. 1 shows a conceptual drawing of a system including an interface between a first and a second chiplet using a package substrate.

In one embodiment, a physical interconnect 100 can be disposed between a first interface 110 disposed on a first chiplet 111, through a package substrate 120 or other support structure, and a second interface 130 disposed on a second chiplet 131.

As described in the Incorporated Disclosures, the physical interconnect 100 can be disposed to communicate using an organic substrate such as a printed circuit board (PCB) between first circuit elements 112 on the first chiplet 111, using first physical interconnect circuit elements 113, and second circuit elements 132 on the second chiplet 131, using a second set of physical interconnect circuit elements 133. Whenever the first circuit elements 112 communicate with the second circuit elements 132, communication can occur using the physical interconnect 100, thus between the first circuit elements 112, the first physical interconnect circuit elements 113, the actual physical interconnect 100, the second physical interconnect circuit elements 133, and the second circuit elements 132.

Accordingly, the first circuit elements 112 and the second circuit elements 132 need not know they are not located on the same chiplet. Communication using the physical interconnect 100 might be somewhat less closely tied than direct connection on the same chiplet. However, otherwise communication between the first circuit elements 112 and the second circuit elements 132, so long as they use a protocol specified for using the physical interconnect 100, should have no substantial difference from communication on the same chiplet.

This can have the effect that the first circuit elements 112 and the second circuit elements 132 can collectively operate substantially as if they were disposed on the same chiplet, without substantial difference except for the possibly of communication that is somewhat less closely tied. Thus, communication might have slightly less bandwidth or slightly greater latency, but otherwise communication should be substantially identical, so long as the first circuit elements 112 and the second circuit elements 132 use a protocol specified for using the physical interconnect 100.

In one embodiment, communication using the physical interconnect 100 can include a communication bandwidth of about 10 gigabits/second (Gbps) per trace, with relatively low power involved for using the physical interconnect 100. This can have the effect that communication between the multiple chiplets need not involve a silicon interposer that is either (A) as large as both chiplets collectively, or (B) specially designed for communication between the multiple chiplets. Moreover, a system using the multiple chiplets can have relatively complete test coverage and need not be substantially limited by cooling or routing requirements.

FIG. 2—Interface Using Computing Device and a Package Substrate

FIG. 2 (collectively including FIGS. 2A-2C) shows a conceptual drawing of a system including an interface between a computing device and a memory device using an organic package substrate such as a printed circuit board (PCB). The interface can include (FIG. 2A) a logic die having a physical interface coupled to the memory device and a separate "gearbox" chiplet disposed to couple that physical interface with the physical interconnect, (FIG. 2B) a logic die and physical interconnect interface, or (FIG. 2O) a memory chiplet including a base die with a stack of memory die coupled to a separate IC chiplet.

The description with respect to this figure is to be regarded as supplemented with the Incorporated Disclosures, including at least, but not limited to, one or more of the following:

U.S. Provisional Appl. 63/184,842, filed May 6, 2021, in the name of inventors Syrus Ziai and Ramin Farjadrad, titled "Implementing complex system-in-package architectures leveraging high-bandwidth long-reach die-to-die connectivity over MCM package substrates".

U.S. Provisional Appl. 63/295,524, filed Dec. 31, 2021, in the name of first inventor Ramin Farjadrad, titled "Innovative low-cost packaging solutions for system in package and the HBM crossover PHY architecture".

Separate Chiplet to Interface with Physical Interconnect

FIG. 2A shows a conceptual drawing of a system including a logic die having a physical interface coupled to the memory device and a separate "gearbox" chiplet disposed to couple that physical interface with the physical interconnect.

In one embodiment, a computing device disposed on a first chiplet 210 can include first computing elements disposed to perform the functions of the computing device. The circuit elements disposed on the first chiplet 210 can include first physical interconnect circuit elements 211 (such as physical interconnect circuit elements) coupled to a physical interconnect 200. The physical interconnect 200 can be disposed to couple chiplets using an organic package substrate 201, such as a printed circuit board (PCB).

In one embodiment, a memory device 220, such as a high-bandwidth memory (HBM) stack including one or more memory chiplets 221, can include an interface logic die 222 disposed with the HBM stack and including an HBM interface circuit 222 disposed to couple the HBM stack to the computing device (as described, disposed on a first chiplet 210).

The HBM interface circuit 222 can be coupled to a "gearbox chipset" 223 disposed to couple to the HBM interface circuit 222 and to translate the interface implemented by the HBM interface circuit 222 to the protocol specified for using the physical interconnect 200.

The gearbox chipset 223 can include second physical interconnect circuit elements 224, disposed to implement the protocol specified for using the physical interconnect 200. The first physical interconnect circuit elements 211 and the second physical interconnect circuit elements 224 can be coupled using the physical interconnect 200 and can collectively implement a physical interconnect protocol.

Accordingly, the memory device 220 can be disposed to interface with the computing device (as described, disposed on a first chiplet 210) using the physical interconnect 200. Therefore, the memory device 220 can connect with the computing device (as described, disposed on a first chiplet 210) over a conventional organic substrate, as opposed to advanced-packaging substrates such as silicon interposer that have many negatives, such as limited size, limited physical interface reach, and very fine trace and pad pitch. For example, the largest silicon today is approximately 2000 mm² in size, its physical interface reach is less than 4 mm, and its pad and trace pitch is less than 50 um, while an organic substrate can be 10,000 mm² in size, its physical interface reach to be greater than 20 mm or more, and its pad and trace pitch is greater than 100 um. Thus, the memory device 220 can couple to the computing device (as described, disposed on a first chiplet 210) using the physical interconnect 200 over the organic substrate, without requiring a silicon interposer.

Combination Logic Die and Physical Interconnect Interface

FIGS. 2B and 2C shows a conceptual drawing of a system including a combination logic die and physical interconnect interface.

In one embodiment, a computing device similarly disposed on a first chiplet 210 can include first computing elements disposed to perform the functions of the computing device. The circuit elements disposed on the first chiplet 210 can similarly include first physical interconnect circuit elements 211 coupled to a physical interconnect 200.

In one embodiment, a memory device 220, such as a high-bandwidth memory (HBM) stack including one or more memory chiplets 221 can include a logic die 222 disposed with the HBM stack and including physical interconnect circuit elements 224 disposed to couple the memory device 220 to the computing device. The physical interconnect circuit elements 224 can be disposed to be coupled to corresponding physical interconnect circuit elements 211 disposed at the computing device, using a physical interconnect 200 coupling chiplets using an organic package substrate 201, such as a printed circuit board (PCB).

Accordingly, the computing device can be disposed to communicate with the memory device 220 using the first physical interconnect circuit elements 211, the physical interconnect 200, and the second physical interconnect circuit elements 224. Thus, the memory device 220 can couple to the computing device (as described, disposed on a first chiplet 210) using the physical interconnect 200 over the organic substrate, without requiring a silicon interposer.

In one embodiment, the logic die 222 can include a network interface and (optionally) a computing device.

For example, the logic die 222 can include an additional computing device and a network interface device disposed thereon. The additional computing device (disposed on the logic die 222) can be disposed to interface with the memory device 220 by receiving and responding to computing commands/controls from the computing device (as described, disposed on a first chiplet 210), using the memory device 220 as its memory device. For one example, the additional computing device (disposed on the logic die 222) can receive database commands/controls from the computing device (as described, disposed on a first chiplet 210), translate those database commands/controls into memory device read/write commands, issue those memory device read/write commands to the memory device 220, translate responses from the memory device 220 into memory device read/write responses, and respond to the computing device (as described, disposed on a first chiplet 210) with those memory device read/write responses. In such cases, the logic die 222 can provide a database interface to the memory device 220 even when the memory device 220 is not so disposed to perform those functions by itself.

The logic die 222 can also include a network interface disposed to route computing and/or memory commands/responses, such as for example read/write commands, between the memory device 220 and other devices. For example, as described herein, the logic die 222 can be disposed to route read/write commands between multiple memory devices 220, to allow those memory devices 220 to be coupled to one or more computing devices (such as described, disposed on a first chiplet 210) without being directly connected thereto. In such cases, one or more computing devices (as described, disposed on a first chiplet 210) can be coupled to multiple such memory devices 220, with one or more such logic dice 222 disposed to route read/write commands (and associated read/write data) between those computing devices (as described, disposed on a first chiplet 210) and the memory devices 220 maintaining the target memory associated with those read/write commands.

In one embodiment, the D2D physical interconnects 100 coupling the computing devices and the memory devices 220 can be disposed to route memory commands/requests to selected memory devices 220 as indicated by the computing devices (as described, disposed on a first chiplet 210). Thus, one or more of the computing devices (as described, disposed on a first chiplet 210) can issue a read/write command to one or more of the memory devices 220, even if the memory device 220 which is a target of the read/write command is not directly coupled to the issuing computing device (as described, disposed on a first chiplet 210). This can have the effect that the computing devices (as described, disposed on a first chiplet 210) can access selected memory devices 220 even when those selected memory devices 220 are not directly coupled to those computing devices (as described, disposed on a first chiplet 210).

FIG. 2C shows a conceptual drawing of a chiplet-based multi-chip module (MCM) 230 that includes a memory chiplet 232 that couples to a second IC chiplet 234 via traces 236 routed over a package substrate 238. The memory chiplet 232 employs a base die 238 that lies beneath a stack of memory die 240. For one embodiment, the memory chiplet takes the form of a high-bandwidth memory (HBM) chiplet.

For one embodiment, the base die 238 includes in-memory compute circuitry 240 and network-on-chip (NoC) circuitry. For one embodiment, the in-memory compute circuitry 240 includes an in-memory processor to perform at least one computing operation on data being written to the memory chiplet or read from the memory chiplet. For one embodiment, the NoC circuitry is configured to route memory commands or requests between chiplets in accordance with a router-based protocol, such as a network-based protocol.

FIG. 3—Computing Devices and Additional Interfaces

FIG. 3 (collectively including FIGS. 3A-3C) shows a conceptual drawing of a system including multiple computing devices coupled to each other and to one or more of: (FIG. 3A) a relatively larger number of memory devices using a set of physical interconnects; (FIG. 3B) an expandable set of additional memory devices and/or other circuit elements; or (FIG. 3C) a set of hybrid interfaces between one or more of the computing devices and an external pool of other devices.

Coupling to Relatively Larger Set of Physical Interconnects

FIG. 3A shows a conceptual drawing of a system including multiple computing devices coupled to each other and to a relatively larger of memory devices using a set of physical interconnects.

In one embodiment, a package 300 includes one or more of the following:

A first ASIC 301 and a second ASIC 302. The first ASIC 301 and the second ASIC 302 can be coupled using an example physical interconnect 100, or an equivalent thereof. The example physical interconnect 100 can be disposed using a package substrate 300a.

A first set of memory devices 301a, such as a first set of high-bandwidth memory devices (HBM), coupled to the first ASIC 301, and a second set of memory devices 302a, also such as HBM devices, coupled to the second ASIC 302. (It is also possible for at least one or more of the HBM devices to be coupled to both the first ASIC 301 and to the second ASIC 302, such as possibly using multiple physical interconnects 100.)

The first ASIC 301 can be coupled to each of the first set of memory devices 301a using an example physical interconnect 200, or an equivalent thereof and the physical interfaces 211 and 224 respectively. Similarly, the second ASIC 302 can be coupled to each of the second set of memory devices 302a using an example physical interconnect 200, or an equivalent thereof and the physical interfaces 211 and 224 respectively. Each physical interconnect 200 can be disposed using the package substrate 300a.

In one embodiment, the package 300 can be disposed so that the first ASIC 301 and the second ASIC 302 each are coupled to an external connection. For example, the external connection can include a relatively long-range coupling to outside of the substrate. Alternatively, the external connection can include a relatively long-range coupling to a device disposed to couple to outside the substrate.

In one embodiment, the package 300 can be disposed so that the first ASIC 301 and the second ASIC 302 are relatively close to one another within the package 300, using the package substrate 300a.

In one embodiment, the package 300 can also be disposed so that the first ASIC 301 is relatively separated from its associated HBMs 301a, and the second ASIC 302 is relatively separated from its associated HBMs 302a. This is possible because the physical interconnect (described with respect to FIGS. 2A-2B) using an organic substrate can cover a substantially longer distance than a physical interconnect using a silicon interposer.

For example, an ASIC chiplet might be approximately 33 mm on a side, an HBM chiplet might be approximately 11 mm on a side, and a physical interconnect using a silicon interposer might be 4 mm at most in length. This would allow only about three HBMs to be coupled to the ASIC on a side. With a substantially longer physical interconnect provided using the organic substrate, each HBM can be disposed substantially farther from the ASIC. This can allow a larger number of HBMs to be coupled to the ASIC using the physical interconnect. For example, as shown in the figure, the ASIC can be coupled to twice as many HBMs as it could be when using a silicon interposer.

In one embodiment, the HBM chiplets can be disposed in a staggered manner. Thus, the HBM chiplets can be disposed in an arrangement other than strictly linear, so that some HBM chiplets are closer and some are farther from the ASIC chiplet. This can have the effect that more HBM chiplets can be disposed on a substrate such as an organic substrate or a printed circuit board (PCB). Because each trace in the D2D physical interconnect can have a lower loss, the traces can be disposed to have a longer reach. The longer reach of the D2D physical interconnect can be used to allow more HBM chiplets to be coupled to the ASIC chiplet.

Moreover, the longer reach of the D2D physical interconnect can be used to coupled larger ASIC chiplets or to couple the ASIC chiplets at a greater distance. This can have the effect that each ASIC chiplet can dissipate more heat without affecting other HBM chiplets that are heat sensitive. This can have the effect that more chiplets can be disposed on a single PCB without providing excessive heat or otherwise requiring extensive cooling means.

Expandable Set of Additional Memory Devices

FIG. 3B shows a conceptual drawing of a system including multiple computing devices coupled to each other and to an expandable set of additional memory devices and/or other circuit elements.

In one embodiment, an alternative package 300 can include one or more of the following:

A first ASIC 301 and a second ASIC 302, similar to those described herein.

A first set of memory devices 301a and a second set of memory devices 302a, similar to those described herein.

A first set of expansion slots 301b, such as coupled to an elastomeric package, such as the package substrate 300a, or such as to a printed circuit board (PCB) 300b, coupled to the first ASIC 301, and a second set of expansion slots 302b, such as similarly coupled. The expansion slots 301b or 302b can be disposed to allow coupling of additional, new, or replacement circuits to the first ASIC 301 and/or the second ASIC 302. For example, the expansion slots 301b or 302b can be disposed to allow additional HBM devices 301a and/or 302a to be coupled to the ASICs 301 and/or 302. For another example, the expansion slots 301b or 302b can be disposed to allow other types of devices to be coupled to the ASICs 301 and/or 302.

As described above with respect to FIG. 3A, the package 300 can be disposed so that a bump pitch on the organic substrate is greater than 100 um. This can provide that the first ASIC 301 can be coupled to its associated expansion slots 301b, and the second ASIC 302 can be coupled to its associated expansion slots 302b. Such associated expansion slots 301b are not generally possible with silicon interposers having micro bumps sized less than 100 um.

In one embodiment, the expansion slots 301b or 302b can each be coupled to an optical, electrical, or other external connection. For example, one or more of the expansion slots 301b or 302b can be coupled to an optical, electrical, or another type of connection to an external chiplet. Similarly, one or more of the expansion slots 301b or 302b can be coupled to an optical, electrical, or another type of connection to a device other than a chiplet, such as a device external to the substrate.

Hybrid Interfaces with External Pool of Other Devices

FIG. 3C shows a conceptual drawing of a system including multiple computing devices coupled to each other and to a set of hybrid interfaces between one or more of the computing devices and an external pool of other devices.

In one embodiment, an alternative package 300 can include one or more of the following:

A first ASIC 301 and a second ASIC 302, similar to those described herein.

A first set of memory devices 301a and a second set of memory devices 301a, similar to those described herein.

A first set of external coupling devices 301b, coupled to the first ASIC 301, such as each disposed to be coupled to a communication link such as a terabits/second (Tbps) fiber link, couplable to an external memory or any other external device disposed to exchange information using such a link, and a second set of external memory coupling devices 302b, coupled to the second ASIC 302, such as similarly coupled. As shown in the figure, the external memory coupling devices 301b or 302b can be disposed relatively close to the first ASIC 301 or the second ASIC 302 or can be disposed at approximately the same or a similar distance from the first ASIC 301 or the second ASIC 302 as the memory devices 301a or 302a respectively.

As described above with respect to FIG. 3A, the package 300 can be disposed so that the first ASIC 301 is relatively separated from its associated external memory coupling devices 301b, and the second ASIC 302 is relatively separated from its associated external memory coupling devices 302b. Similar to FIG. 3A, this is possible because the physical interconnect (described with respect to FIGS. 2A-2B) using an organic substrate can cover a substantially longer distance than a physical interconnect using a silicon interposer.

Interconnection Topologies for Chiplet-Based Multi-Chip Modules (MCMs)

FIG. 4 illustrates a chip topology on an MCM generally designated 400, including a CPU as a first IC chiplet 402, a GPU as a second IC chiplet 404, and an HBM/NoC memory chiplet 406 disposed between the first IC chiplet 402 and the second IC chiplet 404. For one embodiment, the HBM/NoC memory chiplet includes a first port 408 that interfaces with the first IC chiplet 402 and a second port 410 that interfaces with the second IC chiplet 404. The MCM 400 also includes additional memory chiplets 412 and 414 that are disposed on a package substrate 416 in a distributed. For one embodiment, the compute chiplet 402 and the GPU chiplet 404 are interleaved between memory/NoC chiplets 412, 406 and 414. This enables the CPU chiplet 402 to access memory/NoC chiplet 414 through Memory/NoC chiplet 406 and GPU chiplet 404. Additionally, GPU chiplet 404 may access memory/NoC chiplet 412 through memory/NoC chiplet 406 and CPU chiplet 402.

Figure 5:
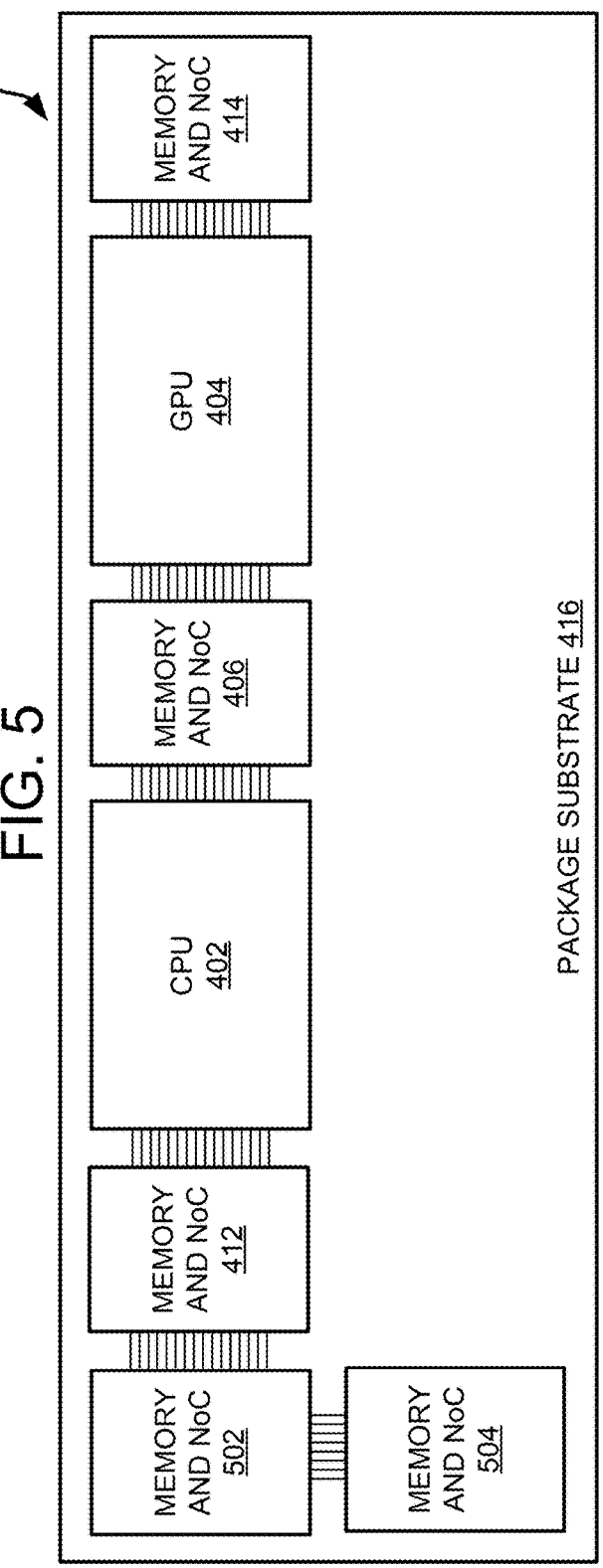
FIG. 5 shows a further interconnection topology similar to that of FIG. 4.

FIG. 5 illustrates an additional architecture that incorporates the topology of FIG. 4 and also includes further memory chiplets 502 and 504 coupled to the memory chiplet 412. For one embodiment, the additional memory devices 502 and 504 provide additional memory capacity for the first IC chiplet 402 without the need for additional corresponding I/O interface circuitry at the edge of the first IC chiplet 402. The first IC chiplet 402 thus may access memory device 502 via the first and second ports of memory chiplet 412. Accessing memory device 504 by the first IC chiplet 402 is per-formed similarly via the first and second ports of memory chiplets 502 and 504.

Figure 6:
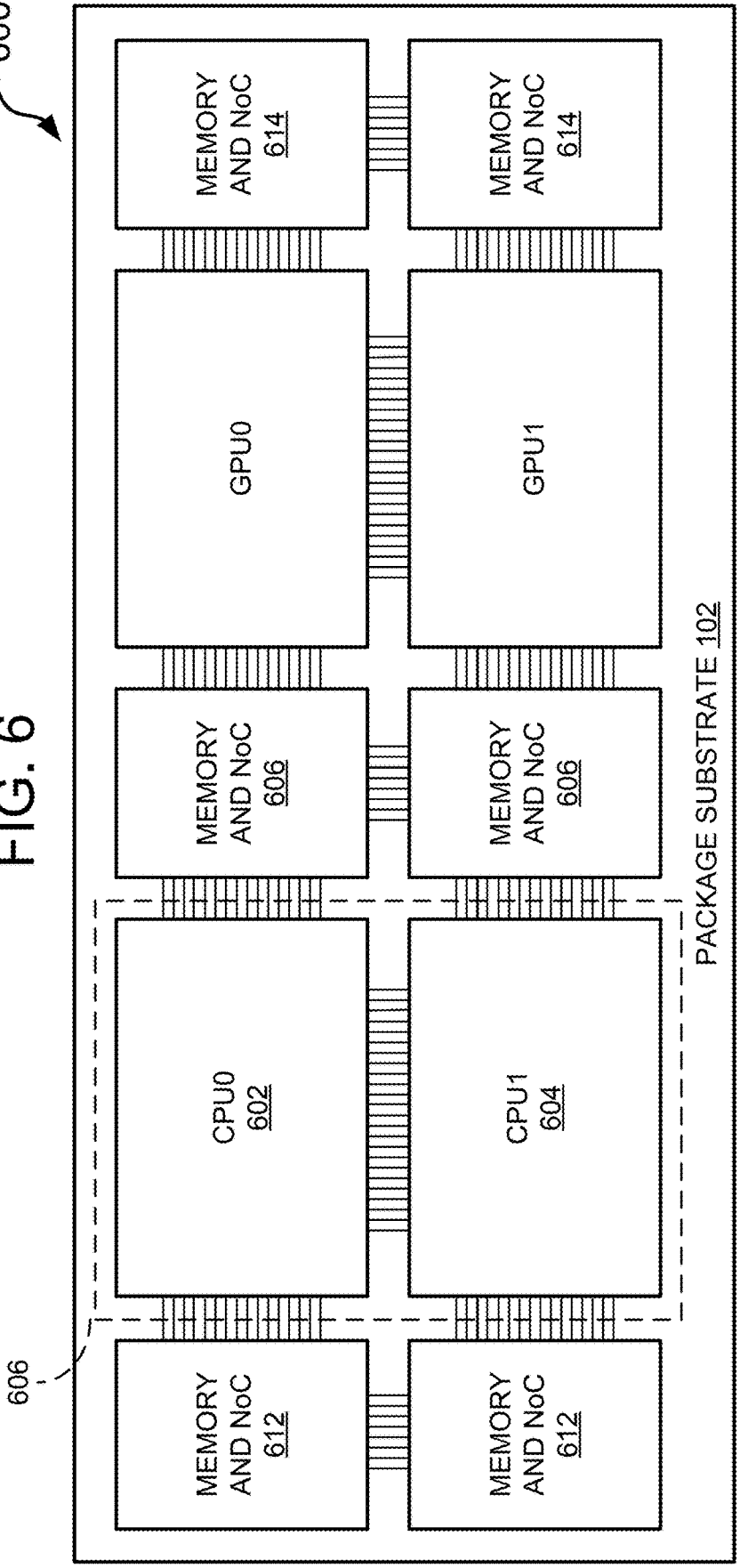
FIG. 6 shows another interconnection topology similar to that of FIG. 4.

FIG. 6 illustrates yet another topology that is similar to the MCM of FIG. 4, with a plurality of memory chiplets 612, 606 and 614 (having memory and NoC circuitry) that are interleaved between various CPU chiplets 602 and 604, GPU chiplets GPU0 and GPU1, and directly connected to other memory chiplets. The architecture of FIG. 6 further scales the architecture of FIG. 4 to include a further disaggregated second level of processing and memory chiplet resources that are straightforwardly interconnected. Such a topology enables a complex compute processing unit (CPU) chip and/or a graphics processing unit (GPU) chip to be partitioned into smaller interconnected chiplets, such as at 602 and 604, that together form a larger processing chiplet 606.

Figure 7:
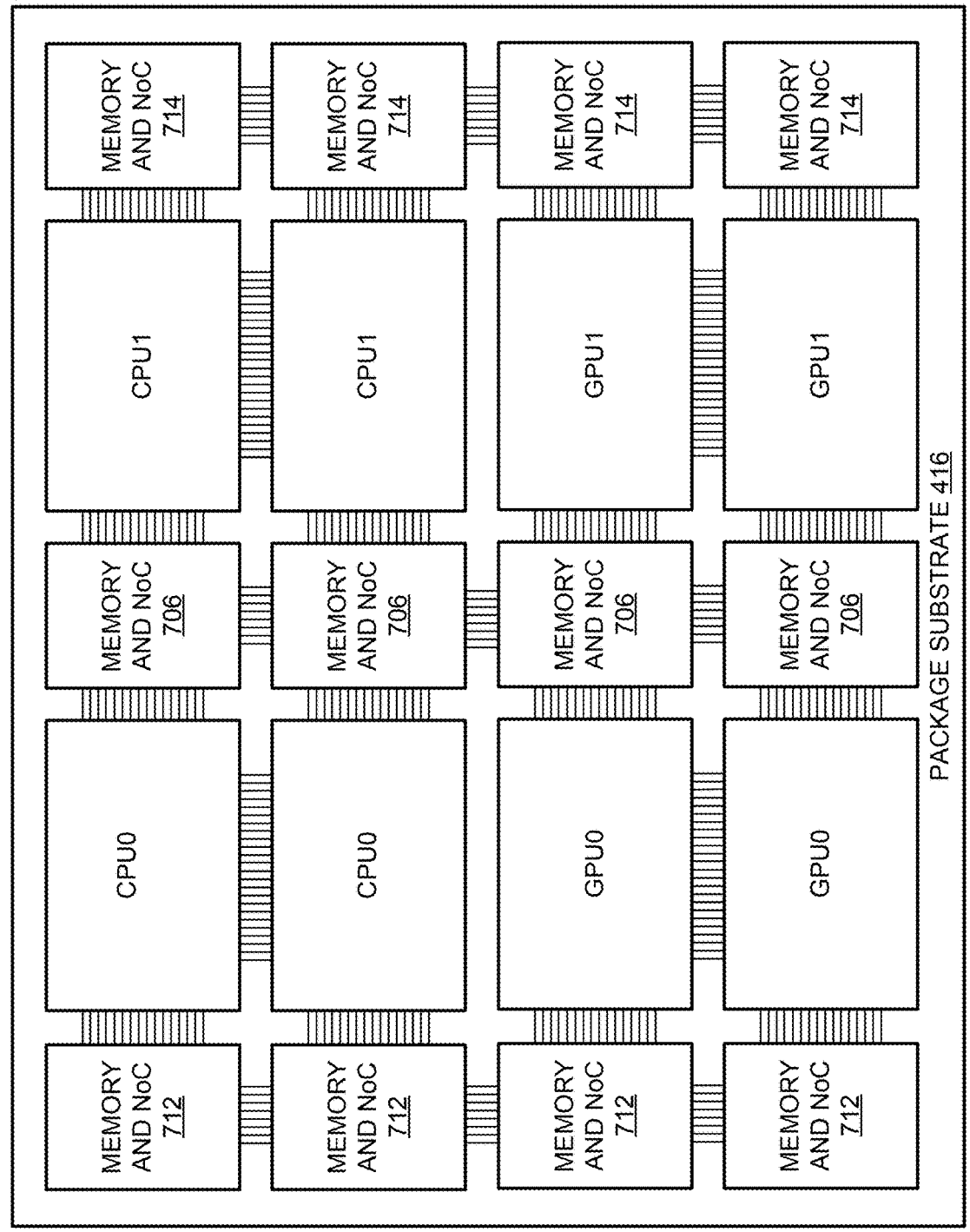
FIG. 7 shows an additional interconnection topology similar to that of FIG. 4.

FIG. 7 illustrates one embodiment of an MCM 700 that is similar to the architecture of FIG. 6, with a plurality of memory chiplets 712, 706 and 714 (having memory and NoC circuitry) that are interleaved between various CPU chiplets and GPU chiplets, with additional third and fourth additional disaggregated levels of processing and memory resources that are interconnected together. The communication between the processing (GPU and/or CPU) chiplets can be done either through direct vertical connection between them (as shown between the two CPU chiplets at top or two GPU chiplets at the bottom) or through one or more multi-port HBM/NoC memory chiplets (such as the communication between the top CPU chiplets and bottom GPU chiplets through the column of HBM/NoC chiplets on the right, or left or middle).

ALTERNATIVE EMBODIMENTS

While this Application primarily describes systems and techniques that primarily relate to physical layer interconnects between chips and/or chiplets, there is no requirement for any such limitation. After reading this Application, those skilled in the art will recognize that the techniques described herein are applicable to a wide variety of devices disposed to interconnect electronic circuitry or portions thereof. For example, the techniques described herein are applicable to a wide variety of different types of devices disposed to interconnect electronic circuitry or portions thereof, and to provide high-bandwidth and/or relatively low-power interconnects therebetween; or otherwise as described herein.

Moreover, after reading this Application, those skilled in the art will recognize that the techniques described herein are applicable to a wide variety of different types of devices which can computing devices, memory devices, specialized hard-ware/software devices such as tensor processing devices (TPUs), video processing devices (VPUs), and a wide variety of different types of electronic circuitry coupling.

This Application describes a preferred embodiment with preferred process steps and, where applicable, preferred data structures. After reading this Application, those skilled in the art would recognize that, where any calculation or computation is appropriate, embodiments of the description can be implemented using general purpose computing devices or switching processors, special purpose computing devices or switching processors, other circuits adapted to particular process steps and data structures described herein, or combinations or conjunctions thereof, and that implementation of the process steps and data structures described herein would not require undue experimentation or further invention.

The claims are incorporated into the specification as if fully set forth herein.

The invention claimed is:

1. A chiplet-based multi-chip module (MCM) to couple to a base substrate, the chiplet-based MCM comprising:
   a package substrate that is separate from the base substrate;
   a first integrated circuit (IC) chiplet coupled to the package substrate and comprising a first memory interface, the first memory interface to transmit memory access information sufficient to carry out a memory access operation; and
   a second IC chiplet comprising a first memory chiplet coupled to the package substrate and comprising:
      at least one dynamic random access memory (DRAM) die comprising a memory space;
      a first port to receive the memory access information to access the memory space, the memory access information issued from the first memory interface of the first IC chiplet;
      a second port to communicate with a third IC chiplet;
      a third port to communicate with the memory space; and
      first network-on-chip (NoC) circuitry to control a transfer of the memory access information from the first port to the second port or the third port via a network-based protocol.

2. The chiplet-based MCM of claim 1, wherein the first memory chiplet comprises:
   a logic base die;
   the at least one DRAM die stacked on the logic base die, the at least one DRAM die comprising the memory space; and
   wherein the logic base die comprises
      the first NoC circuitry;
      the first port;
      the second port; and
      the third port.

3. The chiplet-based MCM of claim 2, wherein:
   the first port comprises a first set of terminals positioned proximate a first edge of the first memory chiplet to couple to a first link, the first link comprising a first set of signal paths to connect the first IC chiplet to the first memory chiplet, the first set of terminals to receive the memory access information from the first IC chiplet that is sufficient to carry out the memory access operation,
   the second port comprises a second set of terminals positioned proximate a second edge of the first memory chiplet to couple to a second link, the second link comprising a second set of signal paths to connect the first memory chiplet to the third IC chiplet.

4. The chiplet-based MCM of claim 3, wherein:
   the first memory chiplet comprises a high-bandwidth memory (HBM) chiplet.

5. The chiplet-based MCM of claim 1, further comprising:
   the third IC chiplet, the third IC chiplet comprising a second memory chiplet comprising a fourth port coupled to the second port of the first memory chiplet, the second memory chiplet comprising second NoC circuitry in communication with the first NoC circuitry.

6. The chiplet-based MCM of claim 5, wherein the first memory chiplet further comprises:
   a fifth port coupled to the first NoC circuitry to communicate with a fourth IC chiplet.

7. The chiplet-based MCM of claim 6, wherein the fourth IC chiplet comprises:
   a third memory chiplet.

8. The chiplet-based MCM of claim 1, wherein:
   the first IC chiplet comprises a first processing unit.

9. The chiplet-based MCM of claim 8, wherein:
   the first processing unit comprises a first central processing unit (CPU) or a first graphics processing unit (GPU).

10. A memory chiplet to couple to a package substrate of a multi-chip module (MCM), the multi-chip module to couple to a base substrate that is separate from the package substrate, the memory chiplet comprising:
    at least one dynamic random access memory (DRAM) die composing a memory space;
    a first port to receive memory access information from a first memory interface of a first integrated circuit (IC) chiplet;
    a second port to communicate with a third IC chiplet;
    a third port to communicate with the memory space; and
    network-on-chip (NoC) circuitry to control a transfer of the memory access information from the first port to the second port or the third port via a network-based protocol.

11. The memory chiplet of claim 10, wherein the memory chiplet further comprises:
    a logic base die;
    the at least one DRAM die stacked on the logic base die; and
    wherein the logic base die comprises:
       the NoC circuitry;
       the first port;
       the second port; and
       the third port.

12. The memory chiplet of claim 11, wherein:
    the first port comprises a first set of terminals positioned proximate a first edge of the memory chiplet to couple to a first link, the first link comprising a first set of signal paths to connect the memory chiplet to the first IC chiplet, the first set of terminals to receive the memory access information from the first IC chiplet;
    the second port comprises a second set of terminals positioned proximate a second edge of the memory chiplet to couple to a second link, the second link comprising a second set of signal paths to connect the memory chiplet to the third IC chiplet.

13. The memory chiplet of claim 12, realized as a high-bandwidth memory (HBM) chiplet.

14. The memory chiplet of claim 10, further comprising:
    a fourth port coupled to the NoC circuitry to communicate with a fourth IC chiplet.

15. A chiplet-based multi-chip module (MCM) to couple to a base substrate, the chiplet-based MCM comprising:
   a package substrate that is separate from the base substrate;
   a processing integrated circuit (IC) chiplet coupled to the package substrate and comprising a first memory interface, the first memory interface to transmit memory access information sufficient to carry out a memory access operation; and
   a high-bandwidth memory (HBM) chiplet coupled to the package substrate and comprising
      a logic base die;
      at least one dynamic random access memory (DRAM) die stacked on the logic base die, the at least one DRAM die comprising a memory space;
      wherein the logic base die comprises
         a first port to receive the memory access information from the first memory interface of the processing IC chiplet;
         a second port to communicate with a third IC chiplet;
         a third port to communicate with the at least one DRAM die; and
         first network-on-chip (NoC) circuitry to control a transfer of the memory access information from the first port to the second port or the third port via a network-based protocol.

16. The chiplet-based MCM of claim 15, wherein:
   the first port comprises a first set of terminals positioned proximate a first edge of the HBM chiplet to couple to a first link, the first link comprising a first set of signal paths to connect the processing IC chiplet to the HBM chiplet, the first set of terminals to receive the memory access information from the processing IC chiplet that is sufficient to carry out the memory access operation.

17. The chiplet-based MCM of claim 15, wherein:
   the second port comprises a second set of terminals positioned proximate a second edge of the HBM chiplet to couple to a second link, the second link comprising a second set of signal paths to connect the HBM chiplet to the third IC chiplet.

18. The chiplet-based MCM of claim 15, wherein:
   the processing IC chiplet comprises a central processing unit (CPU) chiplet or a graphics processing unit (GPU) chiplet.

19. The chiplet-based MCM of claim 15, wherein the HBM chiplet further comprises:
   a fourth port coupled to the first NoC circuitry to communicate with a fourth IC chiplet.

20. The chiplet-based MCM of claim 15, further comprising:
   a second processing IC chiplet directly connected to the processing IC chiplet via a direct connection;
   wherein the processing IC chiplet is configured to communicate with the second processing chiplet through the direct connection or through an indirect connection comprising at least the HBM chiplet.

* * * * *